United States Patent [19]

Suzuki et al.

[11] Patent Number: 4,912,412

[45] Date of Patent: Mar. 27, 1990

[54] MR IMAGING METHOD AND APPARATUS

[75] Inventors: Kazuo Suzuki, Tokyo; Koichi Sano, Sagamihara; Tetsuo Yokoyama, Tokyo; Akira Maeda, Machida, all of Japan

[73] Assignee: Hitachi, Ltd., Tokyo, Japan

[21] Appl. No.: 155,378

[22] Filed: Feb. 12, 1988

[30] Foreign Application Priority Data

Feb. 27, 1987 [JP] Japan .................................. 62-42556
Aug. 19, 1987 [JP] Japan ................................. 62-204003

[51] Int. Cl.$^4$ ........................................... G01R 33/20
[52] U.S. Cl. .................................................... 324/312
[58] Field of Search ....................... 324/307, 309, 312; 128/653; 364/726

[56] References Cited

U.S. PATENT DOCUMENTS 4,718,424  1/1988  Nishimura .......................... 324/309
4,780,675  10/1988 DeMeester et al. ................. 324/309

OTHER PUBLICATIONS

Margosian et al, "Faster Imaging Methods", SPIE, vol. 593, (1985), pp. 6-13.
Feinberg et al, "Halving MR Imaging Time By Conjugation: Demonstration at 3.5 kG Radiology", May (1986), pp. 527-531.
Nishimura et al, "Magnetic Resonance Angiography", Trans. Med Imaging, vol. M1-5, No. 3, (1986), pp. 140-151.

Primary Examiner—Hezron E. Williams
Assistant Examiner—Kevin D. O'Shea
Attorney, Agent, or Firm—Antonelli, Terry & Wands

[57] ABSTRACT

In order to have the number of times of signal measurements in a phase encode direction or a readout direction and raise the speed of imaging, the following steps are performed by way of example:

(i) For a measurement region E required by a conventional method, any desired partial region E+ is set (here, the combination between the region E+ and a region obtained by moving the region E+ in point symmetry with respect to the origin of a measurement space includes the region E).

(ii) A signal h+ is measured on the region E+.

(iii) An image is reconstructed from the signals h+ on a region neighboring the origin, thereby to obtain a phase image $\bar{\theta}$.

(iv) A reconstructed image is obtained by a predetermined computation employing $\bar{\theta}$.

14 Claims, 9 Drawing Sheets

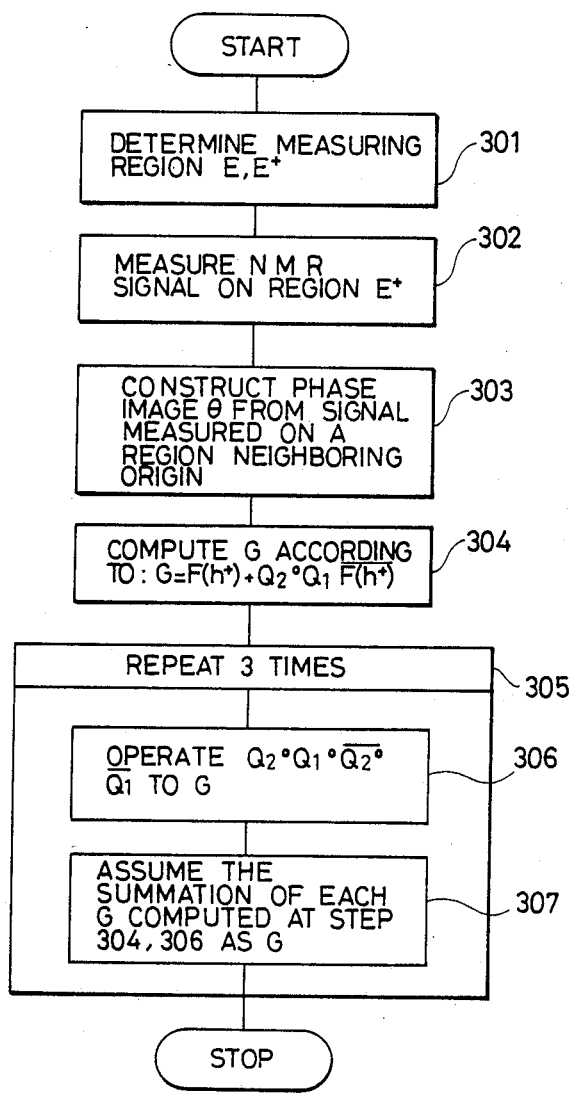

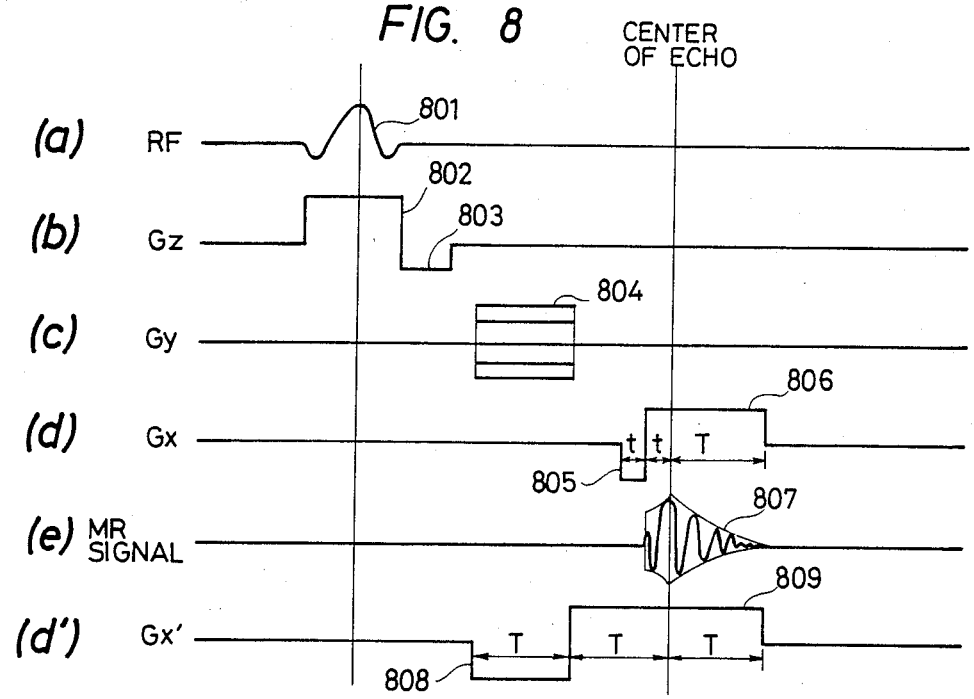
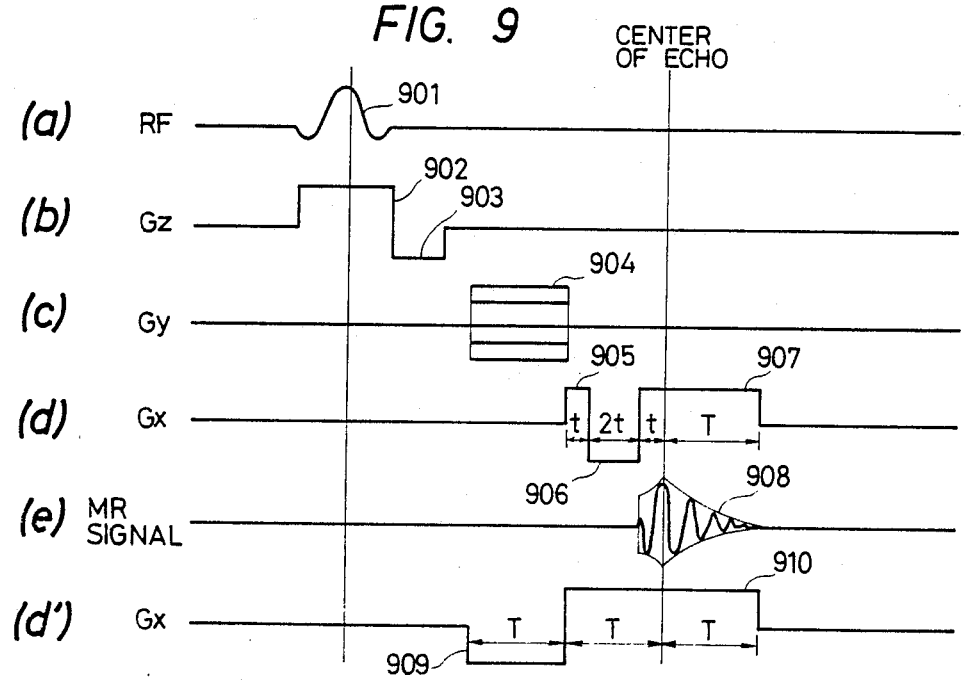

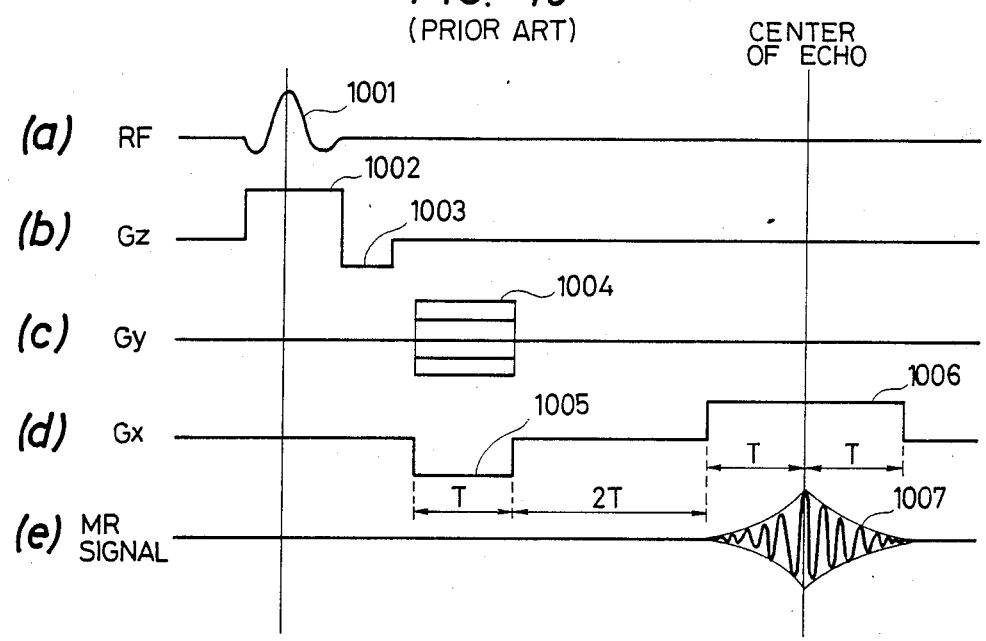
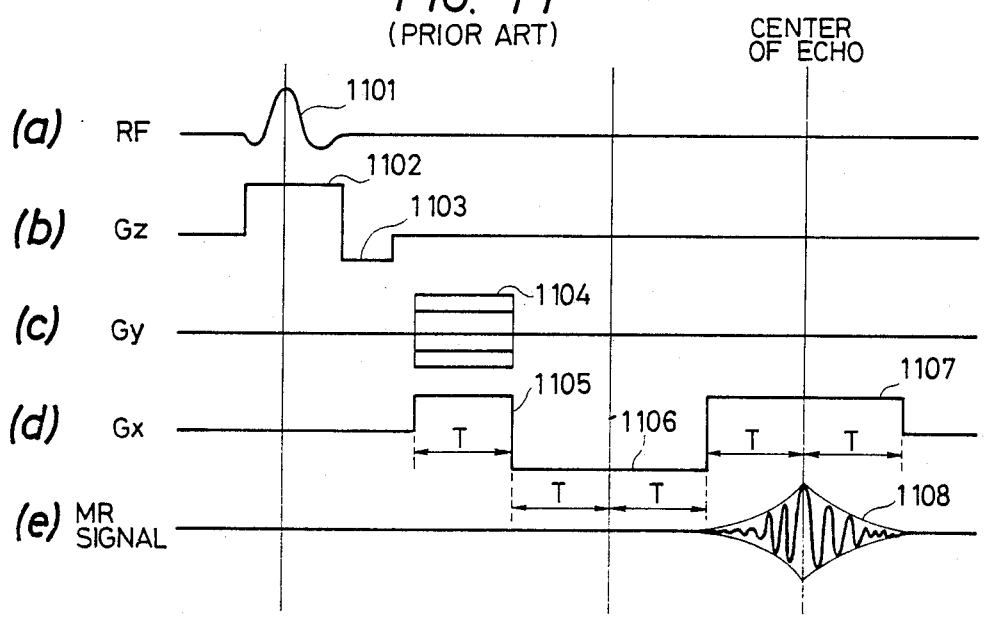

MR IMAGING METHOD AND APPARATUS

BACKGROUND OF THE INVENTION

The present invention relates to a tomographic imaging method and apparatus for a human body, which utilize the phenomenon of nuclear magnetic resonance and which are used for medical diagnoses.

Prior-art techniques close to the present invention are broadly classified into the following two:

[1] Half-Fourier method

[2] Symmetric conjugated method

The method [1] is stated in "SPIE," Vol. 593 (1985), pp. 6–13.

The method [2] is stated in "Radiology," May (1986), pp. 527–531.

The half-Fourier method [1] consists roughly of the steps of:

(i) measuring a signal in the upper half surface (with respect to a phase encode direction) of a region which ought to be measured.

(ii) further measuring several lines below phase encoding O-line so as to determine the value of a phase information parameter Phi, (iii) putting a value 0 (zero) in the remaining unmeasured region (the lower half surface), (iv) Fourier-transforming the values of the measured region constructed by the steps (i) and (iii), and (v) multiplying an obtained image by a term dependent upon the parameter Phi, the real part of the resultant image being regarded as a reconstructed image.

The symmetric conjugated method [2] consists of the steps of:

(vi) measuring signals in the upper half surface of a measurement region and several lines below phase encoding O-line, (vii) giving each point of the remaining unmeasured region the conjugate value of the signal of a measurement point symmetric to that point with respect to an origin, as the estimated value of a signal which ought to have been measured, and (viii) Fourier-transforming the values of the measured region constructed by the steps (vi) and (vii), a resultant image being regarded as a reconstructed image.

The half-Fourier method [1] has had the following problems:

(a) As indicated in the steps (i) and (ii), the region to measure the signals must be limited to the region which consists of the upper (or lower) surface and several central lines.

(b) In the steps (ii) and (v), the phase correction is made using the single parameter Phi. With this process, it is not considered that, in general, phases change complicatedly at various points of an image. As a result, the process forms the cause of an inferior image quality.

The symmetric conjugated method [2] has had the following problem in addition to the above problem (a):

(c) In the estimation of the step (vii), no phasic effect is taken into consideration. As a result, this process forms the cause of an inferior image quality.

Further, prior-art technology for imaging blood vessels is stated in "Trans. Med. Imaging," vol. MI-5, No. 3, pp. 140–151, 1986. As referred to before, the prior art concerning the image reconstruction method by which an image fundamentally the same as a reconstructed image based on the Fourier transformation method is obtained from data items in a number equal to about a half of the number of data items necessary for the Fourier transformation method and the phase information of the image (hereinbelow, this reconstruction method shall be termed the "MR half-Fourier reconstruction method") is discussed in "SPIE," Vol. 593 (1985), Medical Image Processing, pp. 6–13.

Regarding the prior-art blood vessel imaging technology, the technique closest to the present invention among techniques discussed in the aforementioned thesis will now be explained.

First, an image called "sensitive image" is obtained according to a sequence shown in FIG. 10. The steps of the process are as follows:

(i) An RF pulse 1001 for magnetic resonance is impressed simultaneously with the application of a gradient magnetic field 1002 in a z-direction, thereby to excite the magnetization of a specified slice plane. Further, a gradient magnetic field 1003 in the z-direction is applied, thereby to make the phases of the magnetization uniform.

(ii) Thereafter, a gradient magnetic field 1004 in a y-direction is applied for phase encoding.

(iii) A gradient magnetic field 1005 in an x-direction is simultaneously applied, followed by the application of an x-directional gradient magnetic field 1006, during which an MR signal 1007 is measured.

(iv) The gathered MR signals 1007 are subjected to the Fourier transformation, thereby to obtain the reconstructed image.

Subsequently, an image called "insensitive image" is obtained according to a sequence shown in FIG. 11. The steps of the process are as follows:

(i) An RF pulse 1101 for magnetic resonance is impressed simultaneously with the application of a z-directional gradient magnetic field 1102, thereby to excite the magnetization of the specified slice plane. Further, a z-directional gradient magnetic field 1103 is applied, thereby to make the phases of the magnetization uniform.

(ii) Thereafter, a y-directional gradient magnetic field 1104 is applied for phase encoding.

(iii) The application of a series of x-directional gradient magnetic fields 1105, 1106 and 1107 is simultaneously started, and an M signal 1108 is measured during the application of the x-directional gradient magnetic field 1107.

(iv) The gathered MR signals 1108 are subjected to the Fourier transformation, thereby to obtain the reconstructed image.

Next, the sensitive image is subtracted from the insensitive image. The image of the blood vessels is obtained by the above operations, the principle of which is as explained below.

Referring to FIG. 10, the phase rotation of the magnetization ascribable to the application of the x-directional gradient field 1005 and the application of the x-directional gradient field 1006 for a preceding time interval T does not occur in a stationary part because the amounts of application of the former and latter magnetic fields cancel each other. In a blood stream part, however, the magnetization moves inside the gradient fields with velocities, and the amounts of application of the former and latter magnetic fields are not perfectly canceled, so that the phase rotation $\phi$ of the magnetization does not become zero but takes various values, depending upon a blood stream velocity v. Assuming that the velocity v be constant irrespective of time and be in the x-direction, the phase rotation $\phi$ becomes:

$$\phi = 6 \gamma T^2 G_x |v|$$

where $\gamma$ denotes a constant, $G_x$ the gradient of the x-directional gradient field, and T the duration of the application of the x-directional gradient field 1005. Since, however, the blood stream velocity is not constant but exhibits a certain distribution in the direction of the thickness of a slice, the signal actually measured becomes the sum of signals whose phases are distributed at random in the thickness direction of the slice and which cancel one another to afford a small value. In the sensitive image, accordingly, the blood vessels come out dark.

On the other hand, referring to FIG. 11, the phase rotation of the magnetization ascribable to the application of the series of x-directional gradient fields 1105, 1106 and 1107 does not occur in the stationary part. When the blood stream velocity v is assumed to be constant irrespective of time and to be in the x-direction, the phase rotation of the magnetization does not occur in the blood stream part, either. The reason is as stated below. The phase rotation $\phi'$ ascribable to the application of the x-directional gradient field 1005 and the application of the x-directional gradient field 1006 for a preceding time interval T becomes:

$$\phi' = -2 \gamma T^2 G_x |v|$$

on the same ground as in the case of FIG. 10. Likewise, the phase rotation $\phi''$ ascribable to the application of the x-directional gradient field 1006 for a succeeding time interval T and the application of the x-directional gradient field 1007 for a preceding time interval T becomes:

$$\phi'' = +2 \gamma T^2 G_x |v|$$

Eventually, the overall phase rotation $\phi$ becomes:

$$\phi = \phi' + \phi'' = 0$$

Accordingly, the phases do not become random depending upon the stream velocity, so that the blood vessels come out bright in the insensitive image.

Therefore, when the sensitive image is subtracted from the insensitive image, the images of the stationary part are canceled, and only the blood vessels are imaged.

As regards the prior art for imaging blood vessels, another technique will now be described. This technique is characterized in that the angle of the magnetization of a stationary part to be thrown down by an RF pulse for magnetic resonance is set at 360°. Thus, the magnetization of the stationary part is not excited, whereas the magnetization of a blood stream part is excited because it is not perfectly thrown down 360° on account of the stream thereof. Accordingly, when echoes are thereafter caused so as to measure signals, only the signals from the blood stream part are obtained. By way of example, concrete steps may be quite the same as the foregoing steps for obtaining the insensitive image in accordance with the sequence shown in FIG. 11, except that the magnetic resonance RF pulse 1101 in (a) of FIG. 11 is specified to the RF pulse for throwing down the magnetization 360°. Owing to these steps, the blood vessels are imaged by the signal insensitive image.

The prior art for imaging blood vessels is as thus far explained. Now, there will be explained a prior-art technique concerning the MR Half Scan reconstruction method.

All echo signals to-be-measured which are required for attaining a desired resolution when the image reconstructing method is the two-dimensional Fourier transformation method, shall be called the "whole echo signal." On this occasion, when the two-dimensional Fourier transformation method is improved using information on the phase of a reconstructed image, for example, that the reconstructed image is of a real number, substantially the same image as a reconstructed image which is obtained by the two-dimensional Fourier transformation of the whole echo signal can be reconstructed out of data items the number of which is equal to about a half of the number of the data items of the whole echo signal. When this fact is utilized, imaging can be carried out by reducing the number of times of phase encode steps to about a half and without incurring any appreciable degradation in the image quality.

In the prior art for imaging blood vessels, points (1) and (2) mentioned below are not taken into consideration because of the assumption that the blood stream velocity v is constant versus time. Accordingly, the prior art has had the problem that the value of the phase rotation $\phi$ of the blood stream part in the sequence shown in FIG. 11 is usually large for an actual complicated blood stream, so the blood vessels do not come out considerably bright even in the insensitive image.

(1) In an actual blood vessel, especially the artery, the blood stream velocity is always changing due to pulsation.

(2) Even if the blood stream speed is substantially constant, the blood vessel is moving while depicting a complicated curve, and hence, the blood stream velocity as a vector including the direction is changing with time. That is, the differential of higher order of the blood stream velocity with respect to time is not necessarily zero.

On the other hand, the prior art concerning the MR Half Scan reconstruction method has been merely utilized for reducing the number of times of phase encode steps. Therefore, even when this technique is applied to the prior art for imaging blood vessels, the phase rotation of the magnetization in the sequence of each of FIGS. 10 and 11 does not differ at all from the phase rotation which arises without the application of the technique. Accordingly, the aforementioned problem of the prior art for imaging blood vessels remains intact.

SUMMARY OF THE INVENTION

[I] In order to solve the problems of the Prior art a process conforming to the following steps is performed. Here in after, we call this Process as Half Scan Reconstruction method:

(i) For a measurement region E required by the prior-art method, any desired partial region E+ is set (here, the combination between the region E+ and a region obtained by moving the region E+ in point symmetry with respect to the origin of a measurement space includes the region E).

(ii) A signal h+ is measured on the region E+.

(iii) An image is reconstructed from the signals h+ on a region neighboring the origin, thereby to obtain a phase image $\bar{\theta}$.

(iv) An image obtained by computing the following expression (1) is regarded as a reconstructed image:

$$\sum_{n=0}^{N} (Q_2 \; Q_1 \; Q_2 \; Q_1)^n \; (F(h^+) + Q_2 \; Q_1 \; F(h^+)) \quad (1)$$

where F denotes the operation of Fourier transformation, $Q_1$ the operation of multiplication by $e^{2i\tilde{\phi}}$, $\overline{Q_1}$ the operation of multiplication by $e^{-2i\tilde{\phi}}$, $Q_2$ the operation of F E⁻ F⁻¹, $\overline{Q_2}$ the operation of F⁻¹ E⁻ F, E⁻ the operation of multiplication by 0 on the region E+ and by 1 on the other region, and the operation of synthesizing operations. In addition, '—' indicates complex conjugate, 'n' an integer of at leas 0 expressive of the number of times of repetition of operations, and 'N' an integer of at least 0 expressive of the total number of the terms of a series.

(1) Letting K denote the amount of data of signals (of complex number) which are obtained in the case of measurement on the whole region E, the amount of data of the signals measured on the region E+ is K/2 or larger. On the other hand, the amount of data of the phase image $\theta$ (of real number) is K/2. In view of the amounts of data, therefore, it is thought that the combination between the signals h+ measured on the region E+ and the phase image $\theta$ will become equivalent to the signals h measured on the whole region E. A relational formula obtained by actually deriving the equivalent relation is the following expression (2):

$$F(h) = \sum_{n=0}^{\infty} (Q_2 \; Q_1 \; Q_2 \; Q_1)^n \; (F(h^+) + Q_2 \; Q_1 \; F(h^+)) \quad (2)$$

Here, the symbols are the same as in the case of Exp. (1) except that $\tilde{\theta}$ in Exp. (1) is substituted by $\theta$.

(2) In general, the phase image $\theta$ changes slowly in space and therefore has a great low-frequency component, so that it can be estimated sufficiently precisely from the signals on the region neighboring the origin of the measurement space. Accordingly, when Exp. (2) is approximated using the estimated value $\tilde{\theta}$, that is, Exp. (1) is computed, a good image is reconstructed.

(3) The functions of the respective terms of the series denoted by Exp. (2) will be studied. $F(h^{30})$ of the first term gives the contribution of the measured signal (namely, the signal on the region E+) to the image. The second term et seq. ($Q_1 \circ Q_1 \overline{F(h^+)}$) for n=0 and respective terms for n≧1) sequentially estimate unmeasured signals (namely, signals on a region E−E³⁰) on the basis of $\theta$, and give the contributions of the estimated values to the image. Information necessary for the estimation is divided into the contribution of the signal on the region E+ and the contribution of the signals on the region (E−E+) again, and the former is given by the second term ($Q_2 \; Q_1 \; F(h^+)$), while the third term et seq. (respective terms for n≧1) serve for the latter estimation. Thenceforth, similar operations are repeated.

(4) The series of Exp. (2) is expressed so that computative steps may not differ depending upon the shape of the region E+.

Incidentally, the region (E−E+) signifies the complementary set of the region E+ in the whole region E.

The above steps are summed up as illustrated in FIG. 1.

[II] In order to solve the problems of the prior art for reducing the number of times of measurements to about a half a process different from the process described in [I] above, that process to be described below is performed:

By making use of the fact that the high-precision phase map of an image is readily obtained; the phase map of an image reconstructed from the orderzero approximate values of an unmeasured data part is replaced with a high-precision phase map, which is retransformed into measurement data, and the values of the data are utilized as the estimated values of the unmeasured signal part, whereby even when the image has a phase distortion, it is correctly reconstructed.

In a case where the phase map has not been satisfactorily approached by performing the process once, the steps are sequentially repeated.

On this occasion, when the above process is carried out between a measurement space and an image space, the repetition of two-dimensional Fourier transformation proceeds to expend time. However, with note taken of the fact that complete data items are present in the direction of a readout gradient magnetic field (in a transverse direction), one-dimensional data obtained after the one-dimensional Fourier transformation of measured data in the readout direction is processed in a phase encode direction (in a longitudinal direction), whereby the time can be shortened.

The process is illustrated in FIG. 5.

Boxes indicate the contents of the process, which shall be called "steps" below.

Steps 501 thru 503 are quite the same as the steps of the complex symmetric conjugated method. Under this state left intact, an image blurs heavily at parts having phase differences. Naturally, the phase map of the image at this time differs from an intrinsic phase map.

Therefore, only the phase components of the image are replaced with correct values without changing the amplitudes thereof (step 504). As a result, the obtained image as complex numbers becomes closer to a correct image. When the obtained image is subjected to inverse Fourier transformation in the longitudinal direction, the data of the same space as the space after the processing of the step 502 is obtained.

In the data, the data items of a half have the true values of measured data known and are therefore replaced with the values (step 507). Resulting data items in the space become closer to true values.

Therefore, an image obtained by subjecting these data items to Fourier transformation in the longitudinal direction is closer to the true image. If the phase map of the obtained image is sufficiently close to the phase map initially given, the process is ended. If it is still insufficient, the same steps are traced again, whereby the image can be brought closer to the true one in succession.

As the phase distortions are smaller, a smaller number of repetitions suffice. When the process wa applied to images actually taken with an MRI apparatus, images sufficiently close to true images were obtained by repeating the steps once or twice.

[III] In order to solve the problem of the prior art for imaging blood vessels, a process conforming to the following steps is performed:

1. A measured signal is obtained according to a sequence shown in (a), (b), (c), (d) and (e) of FIG. 8.
    (i) An RF pulse 801 for magnetic resonance is impressed simultaneously with the application of a gradient magnetic field 802 in a z-direction, thereby to excite the magnetization of a specified slice plane. Further, a z-directional gradient magnetic field 803 is applied to make the phases of the magnetization uniform.

(ii) Thereafter, a gradient magnetic field 804 in a y-direction is applied for phase encoding.

(iii) Let T denote the half of the length of a time interval during which a signal is to be measured for the purpose of attaining a desired resolution when the image reconstructing method is assumed to be the Fourier transformation method, and let t denote the length of a time interval equal to about 0–40% of the time interval T. Then, a series of gradient magnetic fields 805 and 806 in an x-direction having durations indicated in (d) of FIG. 8 are applied, and an MR signal 807 is measured during the application of the x-directional gradient field 806.

2. The MR signals 807 gathered are subjected to the MR half-Fourier reconstruction method stated before (however, the phase encode direction y and the readout direction x in the prior-art method are handled conversely), whereby a reconstructed image is obtained. Hereinafter, this image shall be called the "short insensitive image."

3. A measured signal is obtained according to a sequence shown in (a), (b), (c), (d') and (e) of FIG. 8.
  (i)' The same step as the step 1, (i).
  (ii)' The same step as the step 1, (ii).
  (iii)' A series of x-directional gradient magnetic fields 808 and 809 set as indicated in (d') of FIG. 8 are applied, and an MR signal 807 is measured at the same timing as in the step 1, (iii).

4. The MR signals 807 gathered are subjected to the MR half-Fourier reconstruction method (however, the phase encode direction y and the readout direction in the prior-art method are handled conversely), whereby a reconstructed image is obtained. Hereinafter, this image shall be called the "short sensitive image."

5. The short sensitive image obtained in the aforementioned operation 4 is subtracted from the short insensitive image obtained in the aforementioned operation 2. Then, the image of blood vessels is obtained.

Alternatively, a process conforming to the following steps is performed:

6. A measured signal is obtained according to a sequence shown in (a), (b), (c), (d) and (e) of FIG. 9.
  (i) An RF pulse 901 for magnetic resonance is impressed simultaneously with the application of a gradient magnetic field 902 in a z-direction, thereby to excite the magnetization of a specified slice plane. Further, a z-directional gradient field 903 is applied to make the phases of the magnetization uniform.
  (ii) Thereafter, a gradient magnetic field 904 in a y-direction is applied for phase encoding.
  (iii) A series of gradient magnetic fields 905, 906 and 907 in an -direction having durations as indicated by the time intervals T and t in (d) of FIG. 9 are applied, and an MR signal 908 is measured during the application of the x-directional gradient field 907.

7. The MR signals 908 gathered are subjected to the MR half-Fourier reconstruction method (however, the phase encode direction y and the readout direction x in the prior-art method are handled conversely), thereby to obtain a reconstructed image. Hereinafter, this image shall be called the "second short insensitive image."

8. A measured signal is obtained according to a sequence shown in (a), (b), (c), (d') and (e) of FIG. 9.
  (i)' The same step as the step 6, (i).
  (ii)' The same step as the step 6, (ii).
  (iii)' A series of x-directional gradient magnetic fields 909 and 910 set as indicated in (d') of FIG. 9 are applied, and an MR signal 908 is measured at the same timing as in the step 6, (iii).

9. The MR signals 908 gathered are subjected to the MR half-Fourier reconstruction method (however, the phase encode direction y and the readout direction x in the prior-art method are handled conversely), thereby to obtain a reconstructed image. Hereinafter this image shall be called the "second short sensitive image."

10. The second short sensitive image obtained in the aforementioned operation 9 is subtracted from the second short insensitive image obtained in the aforementioned operation 7. Then, the image of blood vessels is obtained.

Alternatively, a process conforming to the following steps is performed:

11. The same operation as the above-stated operation 1 (or operation 6) is carried out. However, the magnetic resonance RF pulse 801 (or 901) in (a) of FIG. 8 (or (a) of FIG. 9) is specified to an RF pulse for throwing down the magnetization 360°.

12. The same operation as the above-stated operation 2 (or operation 7) is carried out. A reconstructed image thus obtained is the image of blood vessels.

First, the process for obtaining the short insensitive image in accordance with (a), (b), (c), (d) and (e) of FIG. 8 will be elucidated.

Using the MR Half Scan reconstruction method as the image reconstructing method as described before, the measurement time of the MR signal 807 to be measured can be shortened to the time interval T+t (the symbols T and t being as defined in the foregoing) which is about the half of the time interval usually required. Accordingly, the application interval usually required. Accordingly, the application time of the series of x-directional gradient fields necessary for inducing this MR signal 807 can be shortened as indicated at numerals 805 and 806 in (d) of FIG. 8. In particular, the application time till the center of an echo becomes 2t, which is very short. In consequence, the phase rotation $\phi$ of the magnetization ascribable to the application of the x-directional gradient field and the flow velocity of the blood stream as stated on the prior art can be suppressed to a slight magnitude. Accordingly, even when the velocities of the blood streams in the thickness direction of the slice are various, the phase rotations in this direction equalize to values of substantially zero, and hence, the signals of magnetization of the blood streams do not cancel ne another. It is therefore possible to obtain the insensitive image in which the blood vessels come out bright.

Secondly, the process for obtaining the second short insensitive image in accordance with (a), (b), (c), (d) and (e) of FIG. 9 will be elucidated.

Using the MR Half Scan reconstruction method as the image reconstructing method, the measurement time of the MR signal 908 to be measured suffices with the time interval T +t (the symbols T and t being as defied in the foregoing) which is about the half of the time interval usually required. Accordingly, the application time of the series of x-directional gradient fields necessary for inducing this MR signa 908 and also for making zero the phase rotation for the fixed stream speed as stated on the prior art can be shortened as indicated at numerals 905, 906 and 907 in (d) of FIG. 9. In particular, the application time till the center of an echo becomes 4t, which is very short. In consequence, the phase rotation $\phi$ of the magnetization ascribable to a complicated stream the blood stream velocity of which is not fixed can be suppressed to a slight magnitude. Accordingly, even when the velocities of the blood streams in the thickness direction of the slice are various, the phase rotations in this direction equalize to values of substantially zero, and hence, the signals of magnetization of the blood streams do not cancel one another. It is therefore possible to obtain the second insensitive image in which the blood vessels come out bright.

As regards the short sensitive image obtained according to (a), (b), (c), (d') and (e) of FIG. 8 and the second short sensitive image obtained according to (a), (b), (c) (d') and (e) of FIG. 9, the blood vessels come out dark for the same reason as stated on the sensitive image in the prior art.

As thus far elucidated, the good image of the blood vessels is obtained in such a way that the short sensitive image is subtracted from the short insensitive image, that the second short sensitive image is subtracted from the second short insensitive image, or that the RF pulse which is impressed in obtaining the short insensitive image (or the second short insensitive image) is specified to the pulse for 360°.

BRIEF DESCRIPTION OF THE DRAWINGS

FIG. 3 a flow chart illustrative of processing steps in the first embodiment of the present invention;

FIG. 4(a) is a diagram showing the region of NMR signals necessary for a prior-art image reconstruction method and an example of a partial region for use in the present invention, while

FIGS. 8 and 9 are diagrams each showing an example of a pulse sequence in the third embodiment of the present invention;

FIGS. 10 and 11 are diagrams each showing an example of a pulse sequence which has been utilized in a prior-art technique; and FIG. 12(a) is a diagram showing an example of a measurement region which is utilized in the third embodiment of the present invention, while

DETAILED DESCRIPTION OF THE PREFERRED EMBODIMENTS

Figure 2:
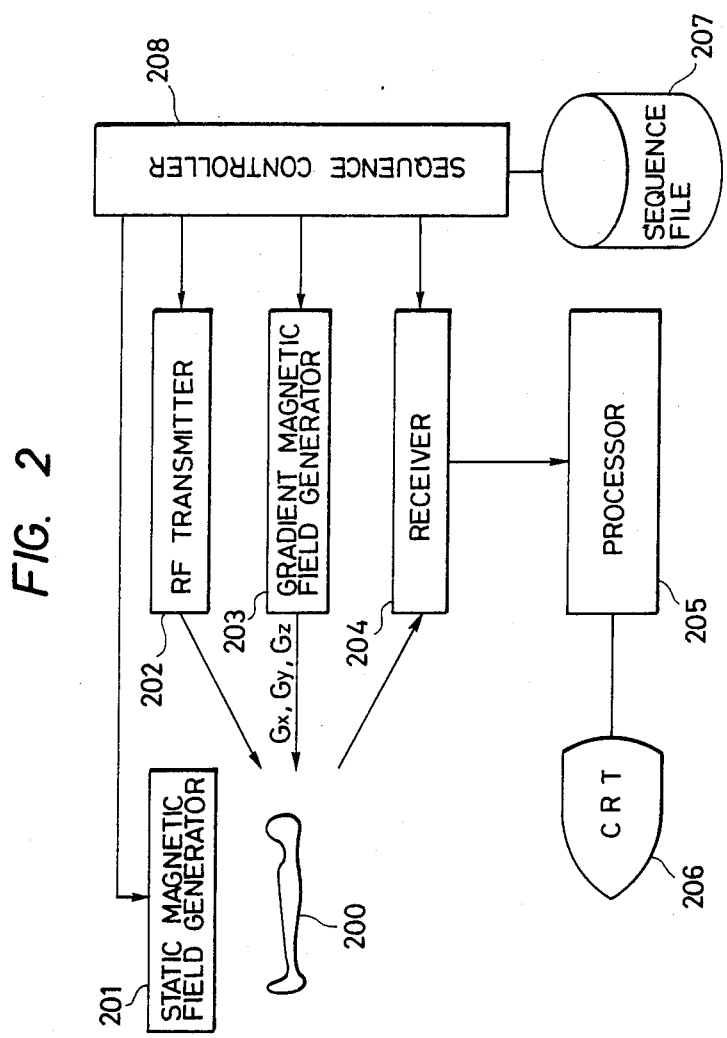
FIG. 2 is a block diagram of an MR imaging system to which the present invention is applied.

The first embodiment of the present invention will be described with reference to FIG. 2–FIG. 4(b). FIG. 2 is a block diagram of an MRI system to which the present invention is applied. Gradient magnetic fields $G_x$, $G_y$ and $G_z$ are generated by a gradient magnetic field generator 203. The field $G_z$ is the gradient field for selecting a section, the field $G_y$ is the phase encoding gradient field for separating a position in a y-direction, and the field $G_x$ is the reading-out gradient field for separating a position in an x-direction. A sequence controller 208 for controlling various pulses and magnetic fields which are generated in order to detect NMR signals from a subject 200, controls an RF transmitter 202 for generating radio-frequency pulses which cause the specified hydrogen spin of the subject 200 to resonate, a static magnetic field generator 201 for generating a static magnetic field which determines the resonance frequency of the NMR signals, the gradient magnetic field generator 203 for generating the gradient magnetic field the intensity and direction of which can be controlled at will, and a receiver 204 for detecting and then measuring the NMR signals which develop from the subject 200. Image reconstruction and various computations are executed by a processor 205 on the basis of the measured signals gathered from the receiver 204, and a reconstructed image is displayed by a CRT display 206.

Figure 1:
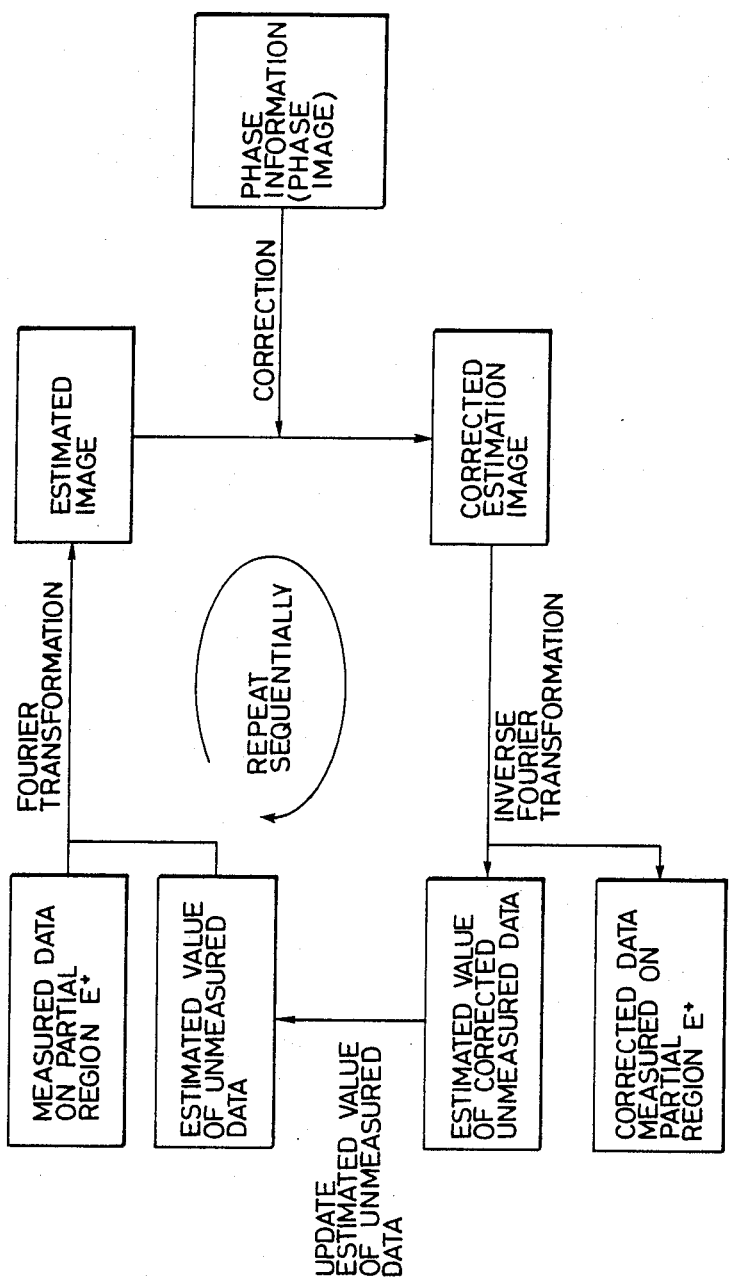
FIG. 1 is a diagram showing the principle of the present invention.
Figure 4A:
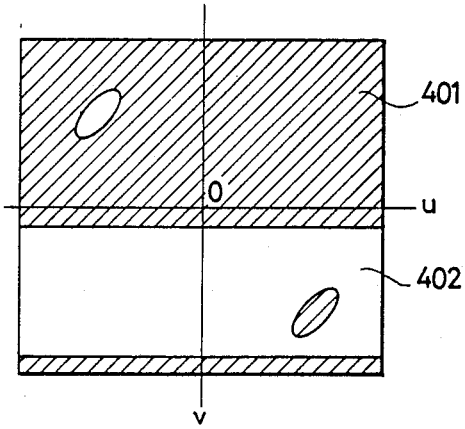

The first embodiment of the present invention having the above construction will be described in connection with FIG. 1, FIG. 3 and FIGS. 4(a) and 4(b). FIG. 1 is a diagram showing the principle on which Exp. (1) expressive of the present invention is grounded, and FIG. 3 is a flow chart showing an example of processing steps which are executed on the basis of this principle and by the processor 205 in FIG. 2. FIG. 4(a) exemplifies a measurement region E for use in the prior art as well as in the present invention and a partial region E+ for use in the present invention, while FIG. 4(b) exemplifies a region which is employed when a phase image $\theta$ is estimated. Now, the steps of performance of the present invention will be described in conjunction with FIG. 3.

Step 301: A measurement region E required by the prior-art method and a partial region E to be actually measured are determined. The region E is the entirety of FIG. 4(a), and the region E+ is hatched parts 401 in FIG. 4(a). A blank part 402 corresponds to $(E-E+)$.

Step 302: NMR signals on the region E+ are measured using the prior-art method of detecting the NMR signals.

Figure 4B:
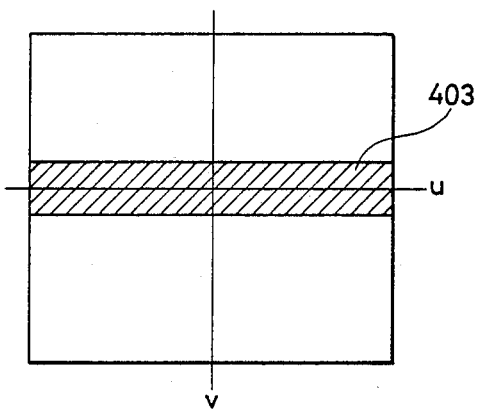
FIG. 4(b) is a diagram showing an example of a region which is used for obtaining a phase image $\theta$.

Step 303: The measured signals in a region neighboring an origin, namely, in a hatched region 403 in FIG. 4(b) are left with the other signals set at zero, they are Fourier-transformed, and the phases $\tilde{\theta}$ of various points of an image obtained are found.

Step 304: The first term (F(h+)) and second term $(Q_2 \circ Q_1 \overline{F(h+)})$ of the series expressed by Exp. (1) are computed by the processor 205 in FIG. 2, and the sum thereof is put as an image G. Substeps therefor are as follows:

(i) With the values of the measured signals h+ given on the region E+ and the value of zero given on the other region, Fourier transformation is performed to obtain F(h+).

(ii) $e^{2i\widetilde{\theta}}$ is evaluated from the phase image $\widetilde{\theta}$ obtained in the step 303, and is multiplied by the conjugate value of F(h+) obtained in (i).

(iii) The result of (ii) is subjected to inverse Fourier transformation.

(iv) The value of the result of (iii) on the region E+ is changed into zero.

(v) The result of (iv) is Fourier-transformed to obtain $Q_2 \circ Q_1 \overline{F(h+)}$.

(vi) The sum between the result of (i) and the result of (v) is taken, and is put as the image G.

Step 305: N is Exp. (1) is set at 3 by way of example, and the following steps 306 and 307 are repeated three times by the processor 205 in FIG. 2.

Step 306: $Q_2 \circ Q_1 \circ Q_2 \circ Q_1$ is caused to operate. Substeps therefor are as follows:

(i) The image G is multiplied by $e^{2i\widetilde{\theta}}$.

(ii) The result of (i) is Fourier-transformed.

(iii) The value of the result of (ii) on the region E+ is changed into zero.

(iv) The result of (iii) is subjected to inverse Fourier transformation.

(v) The result of (iv) is multiplied by $e^{2i\widetilde{\theta}}$.

(vi) The result of (v) is subjected to inverse Fourier transformation.

(vii) The value of the result of (vi) on the region E+ is changed into zero.

(viii) The result of (vii) is Fourier-transformed.

Step 307: The sum between the result of the step 304 and the result of the step 306 is taken, and it is put as the image G anew.

By executing the above steps, Exp. (1) has been computed for N=3.

Next, the second embodiment of the present invention will be described with reference to FIGS. 6 and 7.

Figure 6:
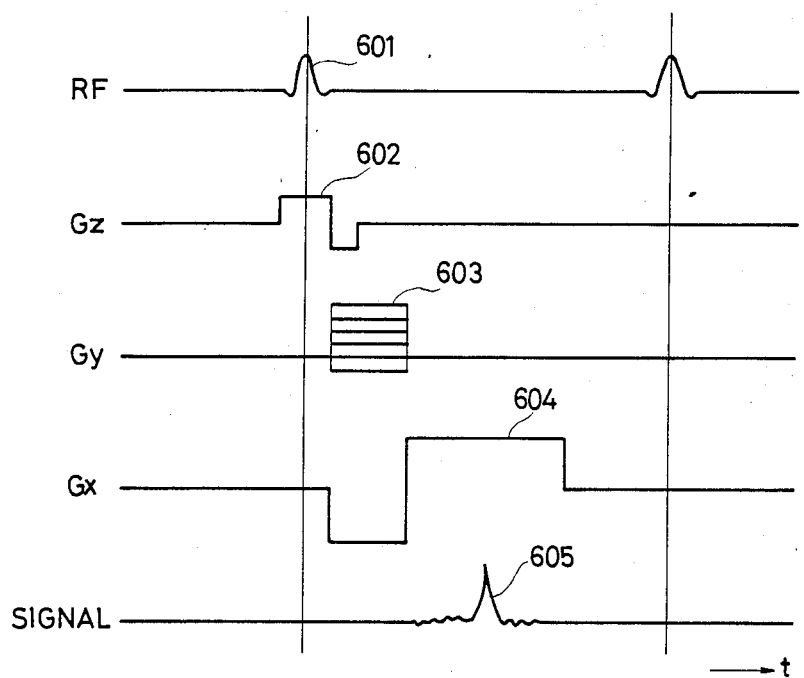
FIG. 6 is a diagram showing an example of a pulse sequence which is used in the imaging of the second of the present invention.

FIG. 6 shows an example of a pulse sequence which is used for imaging in the second embodiment of the present invention. These contents are stored in a sequence file 207 in FIG. 2 beforehand.

In measurement, the hydrogen spins of a subject are first thrown down α degrees by an RF pulse 601. Usually, α is 20–30° or so. On this occasion, a gradient magnetic field $G_z$ 602 is simultaneously applied to select a slice so as to limit it to only a desired plane. Subsequently, a gradient magnetic field $G_y$ 603 is applied so as to change the phase of the spin every position in a y-direction. An amplitude value on this occasion is changed every measurement. A method therefor will be detailed later. Lastly, while a gradient magnetic field $G_x$ 604 is kept applied, a signal 605 is measured.

The above is the first signal measurement. Thenceforth, this unit is repeatedly carried out.

In this case, the phase encoding gradient field 603 is changed each time. In ordinary imaging, it is changed 256 times as follows:

$$G_y(i) = G_{ymax} - \frac{G_{ymax}}{128} \times (i - 1) \quad (1 \leq i \leq 256) \tag{3}$$

where $G_y(i)$ denotes the amplitude in the i-th repeated operation, and $G_{ymax}$ the maximum value of $G_y$.

In the present invention, for the purpose of reducing the number of times of measurements, i in Exp. (3) is changed as follows by way of example:

$$1 \leq i \leq 144$$

Here, i may be a numerical value which exceeds 128 being the half.

Figure 7:
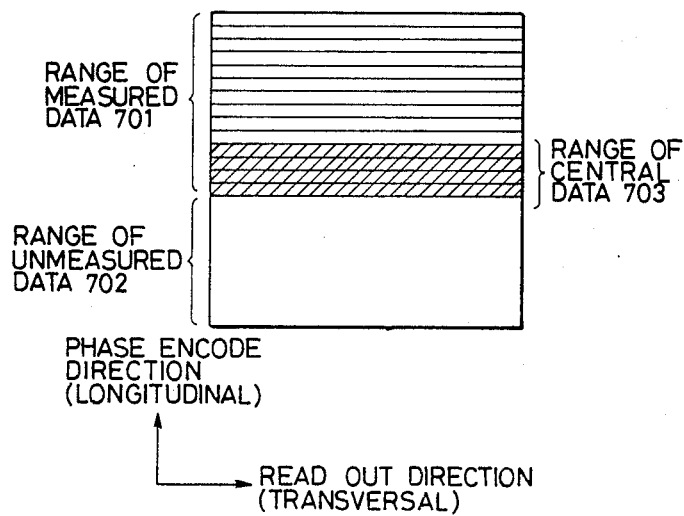
FIG. 7 is a diagram showing the range of measurement data for use in the present invention.
Figure 12A:
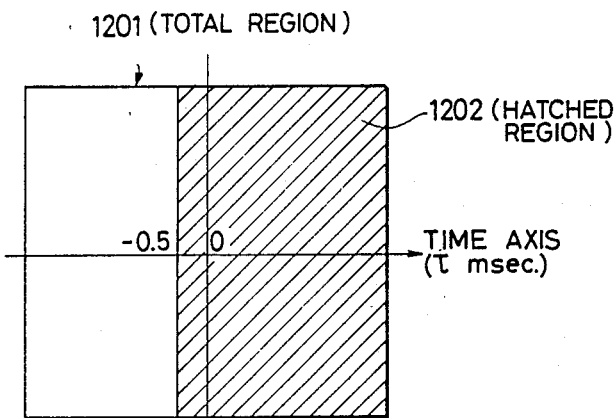
Figure 12B:
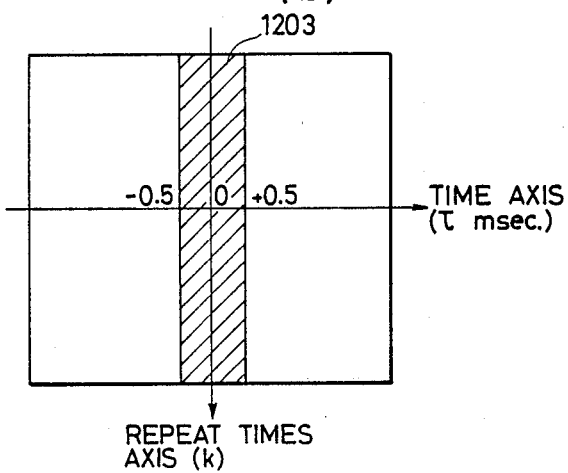
FIG. 12(b) is a diagram showing an example of a region which is utilized for obtaining a phase $\tilde{\theta}$ in the third embodiment of the present invention.

The situation of measurement data obtained in this case is shown in FIG. 7. In each time of measurement, one line in a range of measured data 701 is measured in order from above. When the number of 256 times is reduced to the number of 144 times, the data items of 112 lines in a range of unmeasured data 702 are deficient.

In addition, the phase map of an image can be calculated using data items in a range of central data 703. This process utilizes the point that the phase map changes smoothly. The range of central data 703 corresponds to the low frequency components of the longitudinal frequency of the image. Therefore, when they are Fourier-transformed to evaluate phases, these phases present a phase map of considerably high accuracy.

Of course, values measured with the phantom or the like beforehand may well be used for the phase map.

Figure 5:
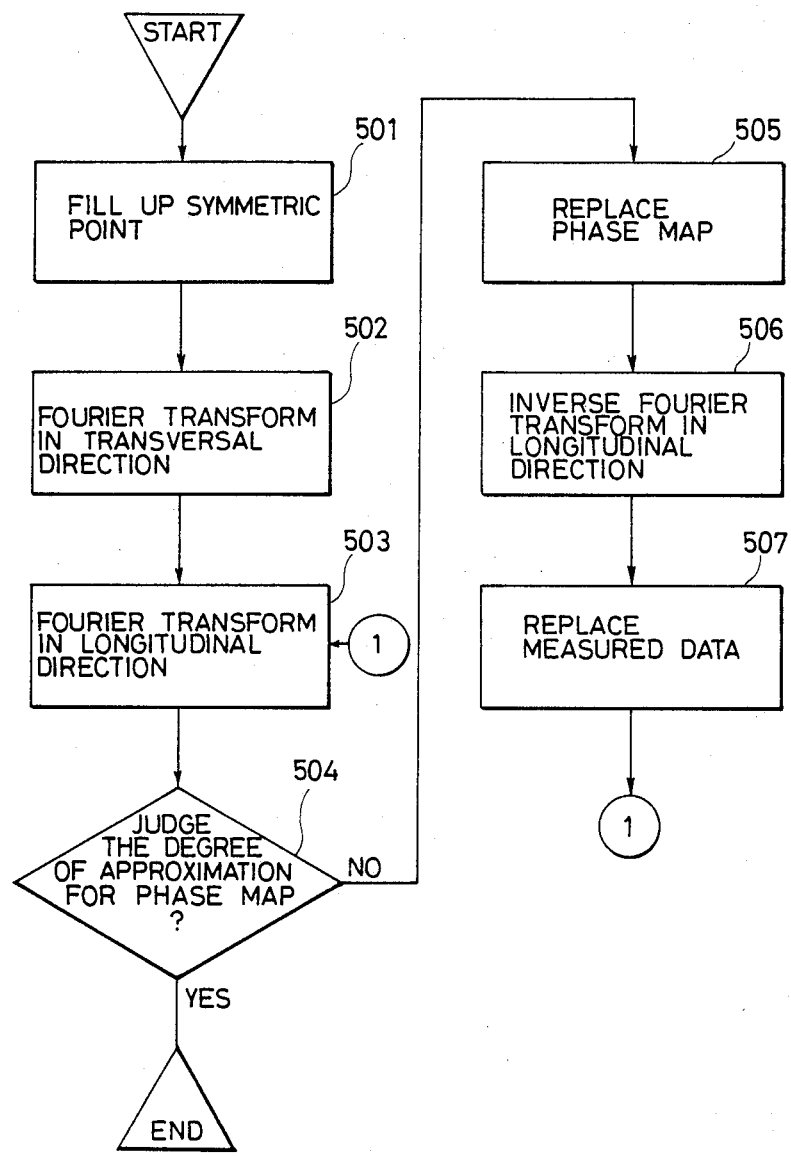
FIG. 5 is a flow chart showing an example of the processing steps of the second embodiment of the invention.

The image reconstructing process in the above case where the measured data as indicated in FIG. 7 has been obtained by the arrangement in FIG. 2 and using the pulse sequence in FIG. 6, will be described with reference to FIG. 5. This process is executed by the processor 205.

Step 501: Regarding the data within the measurement space of FIG. 7 obtained on the basis of the sequence of FIG. 6, the complex conjugate values of data items lying at positions symmetric with respect to the central origin of the space are taken as data items in the range of unmeasured data, and they are used as the estimated values of the unmeasured data items.

Step 502: Fourier transformation operations in a transverse direction are carried out in the number of times of measurements every line.

Step 503: Fourier transformation operations in a longitudinal direction are carried out in the number of sampled points in the transverse direction.

Step 504: An image obtained becomes a complex number, and phase components $\theta'$ (x, y) are evaluated at the respective points so as to obtain a phase map. The difference between this map and the correct phase map $\theta(x, y)$ obtained beforehand is assessed. If the difference is sufficiently small, the precision of the estimated values is judged to be high. Then, the process is ended, and the absolute values of the image are output to the CRT 206.

If the difference is great, the process proceeds to the next step.

Step 505: Only the phase components of the map are replaced with $\theta(x, y)$. That is, $$M'(x, y) = \delta'(x, y) \, e^{i\theta(x, y)}$$

where $\delta'(x, y)$: amplitude of an estimated image, $M'(x, y)$: estimated image.

Step 506: The image $M'(x, y)$ obtained in the preceding step is subjected to inverse Fourier transformation in the longitudinal direction (y-direction).

Step 507: Among data items obtained in the preceding step, the data items within the range of measured data in FIG. 7 are replaced with the data items obtained in the step 502. Subsequently, the process returns to the step 503.

In the steps thus far described, the data once Fourier-transformed in the transverse direction is subjected to the processing of one-dimensional Fourier transformation. In this respect, even when the measured data itself is subjected to the processing of two-dimensional Fourier transformation, an image is of course obtained. However, a processing time which is double longer is required.

Moreover, even in a case where the unmeasured data region is estimated by any method other than the present embodiment, a raised processing speed can be generally attained by employing the data once Fourier-transformed in the transverse direction, instead of repeatedly executing the processing steps between the measured data and the image data.

Lastly, the third embodiment of the present invention will be described with reference to FIG. 8–FIGS. 12(a) and 12(b). FIG. 8 shows an example of a pulse sequence which is used for imaging in the third embodiment of the present invention.

Embodiment 3-1

Step A01: A measured signal is obtained according to a sequence illustrated in (a), (b), (c), (d) and (e) of FIG. 8. That is, while k is being changed to values $k = -127$ through 128, the following substeps (i)–(iii) are repeated 256 times, thereby to obtain measured signals $S^+(\tau, k)$. On this occasion, a subject is placed under a static magnetic field of 5000 G (Gauss).

(i) An RF pulse 801 for magnetic resonance, which throws down magnetization 90°, and a gradient magnetic field $G_z$ (0.3 G/cm) 802 in a z-direction are applied for 4 msec, thereby to excite the magnetization of a specified slice plane. Further, a z-directional gradient magnetic field $-G_z$ 803 is applied for 2 msec, thereby to make the phases of the magnetization uniform.

(ii) Thereafter, a gradient magnetic field $G_y \cdot k/128$ ($G_y = 0.3$ G/cm) 804 in a y-direction is applied for 4 msec.

(iii) Thereafter, a gradient magnetic field $-G_x$ ($G_x = 0.3$ G/cm) 805 in an x-direction is applied for 0.5 msec. Subsequently, an x-directional gradient magnetic field $G_x$ 806 is applied for 4.5 msec, while at the same time an MR signal 807 is measured. Thenceforth, the lapse of 500 msec is waited.

Step A02: The measured signals $S^+(\tau, k)$ 807 gathered are subjected to the reconstruction method according to the present invention (in which the phase encode direction y and readout direction x in the prior-art method are handled conversely), thereby to obtain a short insensitive image.

(iv) The point of time of the center of an echo is put to be $\tau = 0$. A region 1201 determined in such a way that $\tau$ has a range of $-4$ msec $-4$ msec and that k has the range of $-127$ $-128$, shall be called the "whole region E." A region 1202 in which the signals have been actually measured by the step A01, shall be denoted by $E^+$. At this time, the following processing stages are performed by the processor 205 in FIG. 2:

(iv-1) The measured signals in a region 1203 neighboring an origin (a point of $(\tau, k) = (0, 0)$ are left with the other signals set at zero, whereupon Fourier transformation is executed on the region E. The phases $\tilde{\theta}(x, y)$ of the various points of an image thus obtained are evaluated.

(iv-2) Under the condition that the values of the measured signals $S^+(\tau, k)$ are given on the region $E^+$ with the value zero given on the other region, Fourier transformation is executed on the region E, thereby to obtain $F(S^+)$.

(iv-3) $e^{2i\tilde{\theta}}$ is evaluated from the phases $\tilde{\theta}(x, y)$, and it is multiplied by the conjugate values of $F(S^+)$.

(iv-4) The result of (iv-3) is subjected to inverse Fourier transformation.

(iv-5) The values of the result of (iv-4) on the region $E^+$ are changed into zero.

(iv-6) The result of (iv-5) is Fourier-transformed.

(iv-7) The sum between the result of (iv-2) and that of (iv-6) is taken, thereby to obtain a short insensitive image.

Step A03: A measured signal is obtained according to a sequence illustrated in (a), (b), (c), (d') and (e) of FIG. 8. That is, while k is being changed to values $k = -127$ through 128, the following substeps (v)–(vii) are repeated 256 times, thereby to obtain measured signals $S^+(\tau, k)$. On this occasion, the subject is placed under a static magnetic field of 5000 G.

(v) The same as the step A01-(i).

(vi) The same as the step A01-(ii).

(vii) Meanwhile, an x-directional gradient magnetic field $-G_x$ ($G_x = 0.3$ G/cm) 808 is applied for 4 msec. Subsequently, an x-directional gradient magnetic field $G_x$ 809 is applied for 8 msec. The measurement of an MR signal 807 is done at the same timing as in the step A01-(iii). Thereafter, the lapse of 500 msec is waited.

Step A04: In quite the same way as in the step A02, the MR half-fourier method stated before is applied to the measured signals $S^+(\tau, k)$ gathered, thereby to obtain a short sensitive image.

Step A05: The short sensitive image is subtracted from the short insensitive image.

According to this embodiment, a good image of blood vessels can be obtained.

Embodiment 3-2

Quite the same operations as the steps A01 and A02 in the embodiment 3-1 are performed, except that the magnetic resonance RF pulse 801 in the step A01-(i) is altered into an RF pulse which throws down the magnetization 360°. Thus, a short insensitive image is obtained as the image of blood vessels.

According to this embodiment, a good image of blood vessels can be obtained by one time of imaging.

Embodiment 3-3

Step B01: The following operation is repeated 40 times for a subject which is placed under a static magnetic field of 5000 G.

(i) An RF pulse for magnetic resonance, which throws down magnetization 20°, is applied for 4 msec, whereupon the lapse of 26 msec is waited.

Step B02: Immediately after the step B01, a measured signal is obtained according to a sequence illustrated in (a), (b), (c), (d) and (e) of FIG. 9 for the subject placed under the static magnetic field of 5000 G. That is, while k is being changed to values $k = -127$ thru 128, the following substeps (ii)–(iv) are repeated 256 times so as to obtain measured signals $S^+(\tau, k)$:

(ii) A magnetic resonance RF pulse 901 for throwing down magnetization 20° and a gradient magnetic field $G_z$ (0.3 G/cm) 902 in a z-direction are applied for 4 msec, thereby to excite the magnetization of a specified slice plane. Further, a z-directional gradient magnetic field $-G_z$ 903 is applied for 2 msec, thereby to make the phases of the magnetization uniform.

(iii) Thereafter, a gradient magnetic field $G_y \cdot k/128$ ($G_y = 0.3$ G/cm) 904 in a y-direction is applied for 4 msec.

(iv) Thereafter, a gradient magnetic field $G_x$ ($G_x = 0.3$ G/cm) 905 in an x-direction is applied for 0.5 msec, followed by the application of an x-directional gradient magnetic field $-G_x$ 906 for 1 msec. Subsequently, an x-directional gradient magnetic field $G_x$ 907 is applied for 4.5 msec, while at the same time an MR signal 908 is measured. Thenceforth, the lapse of 10 msec is waited.

Step B03: In quite the same way as in the step A02 of the embodiment 3-1, the MR half-Fourier reconstruction method is applied to the measured signals $S^{30}(\tau, k)$ 908 gathered, thereby to obtain a third short insensitive image.

Step B04: The same as the step B01.

Step B05: Immediately after the step B04, a measured signal is obtained according to a sequence illustrated in (a), (b), (c), (d') and (e) of FIG. 9 for the subject placed under the static magnetic field of 5000 G. That is, while k is being changed to values $k = =127$ thru 128, the following sub-steps (v)–(vii) are repeated 256 times so as to obtain measured signals $S^+(\tau, k)$.

(v) The same as the step B02-(ii).
(vi) The same as the step B02-(iii).
(vii) Meanwhile, an x-directional gradient magnetic field $-G_x$ ($G_x = 0.3$ G/cm) 909 is applied for 4 msec. Subsequently, an x-directional gradient magnetic field $G_x$ 910 is applied for 8 msec. The measurement of an MR signal 908 is done at the same timing as in the step B02-(iv). Thereafter, the lapse of 10 msec is waited.

Step B06: In quite the same way as in the step B03, the MR half-Fourier reconstruction method is applied to the measured signals $S^+(\tau, k)$ 908 gathered, thereby to obtain a third short sensitive image.

Step B07: The third short sensitive image is subtracted from the third short insensitive image.

According to this embodiment, a good image of blood vessels can be obtained at high speed.

The present invention brings forth the following effects:

[I] Even when the shapes of a measurement region E and a partial region E+ are various, an image can be reconstructed by the same processing steps. On this occasion, unmeasured signals can be estimated sufficiently precisely by taking phases $\theta$ into consideration, and hence, it becomes possible to obtain a good reconstructed image. As a result, an image substantially equal in quality to a reconstructed image which is obtained when signals are measured on the whole measurement region can be obtained from only measured signas on the partial region, so that the amount of signals to be measured can be reduced to about a half.

[II] An image having the same resolution and contrast as those of an image which is obtained in case of measuring all data items can be obtained from measured data items about a half in number. Accordingly, the throughput of imaging is increased to about two times. In addition, even high-speed imaging has heretofore required 5 seconds–10 seconds and made it difficult to stop the breathing of a patient in the imaging of the abdomen, whereas the invention can image the abdomen in a substantially clinically practicable time of 2.5 seconds–5 seconds.

Besides, since data after the measured data items have been once Fourier-transformed in a transverse direction is processed, a processing time can be shortened to about ½ of that required in case of directly processing the measured data items.

[III] The amount of application of gradient magnetic fields necessary before the echoing of an MR signal is sharply curtailed, so that the phase rotation of magnetization attributed to the application of the gradient fields and the velocity of a blood stream can be suppressed to a slight magnitude even for the complicated blood stream whose actual velocity cannot be regarded as being constant. Accordingly, even when the velocities of blood streams in the thickness direction of a slice are various, the phase rotations in this direction equalize to values of nearly zero, and hence, the signals of the magnetizations of the blood streams hardly cancel one another. It is therefore possible to obtain a good image of blood vessels in which th blood vessels come out bright.

We claim:

1. An MR imaging method comprising the step of generating a static magnetic field, gradient magnetic fields and a radio-frequency magnetic field; the step of measuring NMR signals from an object to-be-examined on an arbitrary partial region which is so determined that, in the partial region of a measurement region required for obtaining both a real part and an imaginary part of a reconstructed image at a desired resolution, the partial region itself and a region obtained by moving the partial region in point symmetry with respect to an origin of a measurement space include the whole measurement region when combined; and the step of reconstructing the image by combining the measured signals and phase information on the reconstructed image; wherein the signals measured on the partial region are subjected to Fourier transformation and then corrected with the phase information on an image space, whereupon the corrected signals are subjected to inverse Fourier transformation to be brought back onto the measurement space again, thereby to obtain estimated values of unmeasured signals, and the reconstructed image is obtained using the estimated values.

2. An MR imaging method according to claim 1, wherein the estimated values of unmeasured signals and the signals measured on said partial region are subjected to Fourier transformation and then corrected with the phase information on an actual space, whereupon the corrected signals are subjected to inverse Fourier transformation to be brought back onto said measurement space again, thereby to update the estimated values of the measured signals, and the reconstructed image is obtained using the estimated values obtained lastly by sequential repetition of the updating.

3. An MR imaging method according to claim 1, wherein the phase information is a phase image which expresses phase values of various points of the reconstructed image, and the correction is to take complex conjugate values of the Fourier-transformed signals and thereafter rotate phases thereof double the phase values.

4. An MR imaging method according to claim 1, wherein the correction with the phase information is a correction in which phase values of data after the Fourier transformation of the measured signals are replaced with phase information on the image to-be-reconstructed.

5. An MR imaging method according to claim 3 or claim 4, wherein the phase image is estimated and obtained from the signals measured on said partial region neighboring the origin of said measurement space.

6. An MR imaging method according to claim 2, wherein when the reconstructed image has at least two dimensions, and the measured signals are Fourier-transformed in relation to variables of respective axes.

7. An MR imaging method according to claim 6, wherein for estimating unmeasured data, the image from measured data of a measured part of a measurement space and, phase information of the image is estimated so that the measured data is first subjected to one-dimensional Fourier transformation in a readout direction and thereafter subjected to a reconstructing process in only a phase encode direction.

8. An MR imaging method according to claim 6, wherein inverse Fourier transformation of the corrected signals is effected in relation to the variable of one of the axes.

9. An MR imaging method comprising the step of generating a static magnetic field, gradient magnetic fields and a radio-frequency magnetic field; the step of measuring some of all echo signals which need to be measured for imparting a desired resolution to an image reconstructed by a Fourier transformation method, in such a way that a radio-frequency magnetic field is applied to an object to-be-examined under a static magnetic field so as to cause nuclear magnetic resonance, followed by application of a phase encoding gradient magnetic field, that a gradient magnetic field having a gradient in a readout direction is thereafter applied so as to measure an echo signal, and that all the echo signals and a total amount of application which is an amount of application of gradient magnetic fields necessary for measuring all the echo signals are subjected to any at least one of the following four substeps (1)–(4); the step of reconstructing an image by the use of the measured signals; and the step of extracting an image of a blood stream part from the reconstructed image:

(1) the substep of applying the gradient magnetic field having the gradient in the readout direction, less than a half of the total amount of application, and subsequently applying a gradient magnetic field having a gradient in the readout direction and being opposite in polarity to the former gradient magnetic field, simultaneously with the measurement of the echo signal, (2) the substep of applying the gradient magnetic field having the gradient in the readout direction and a gradient magnetic field having a gradient in the readout direction and being opposite in polarity to the former gradient magnetic field, at least once so that a summation of amounts of application of both the gradient magnetic fields may be less than a half of the total amount of application, and thereafter applying a gradient magnetic field in the readout direction, simultaneously with the measurement of the echo signal, (3) the substep of applying the gradient magnetic field having the gradient in the readout direction, less than a half of the total amount of application, subsequently applying a magnetization inverting radio-frequency magnetic field, and subsequently applying a gradient magnetic field having a gradient in the readout direction and being opposite in polarity to the gradient magnetic field applied first, simultaneously with the measurement of the echo signal, and (4) the substep of applying a magnetization inverting radio-frequency magnetic field, applying the gradient magnetic field having the gradient in the readout direction and a gradient magnetic field having a gradient in the readout direction and being opposite in polarity to the former gradient magnetic field, at least once before and after the magnetization inverting radio-frequency magnetic field so that a difference between a summation of amounts of application before the radio-frequency magnetic field and a summation of amounts of application after the radio-frequency magnetic field may be less than a half of the total amount of application, and thereafter applying a gradient magnetic field having a gradient in the readout direction, simultaneously with the measurement of the echo signal.

10. An MR imaging method according to claim 9, wherein the step of reconstructing an image include applying an image reconstructing method in which the image having the desired resolution is reconstructed from some of all the echo signals and information on phases of the image.

11. An MR imaging method according to claim 9, wherein the image of the blood stream part is extracted from the reconstructed image by executing a subtraction between reconstructed images obtained by application of the gradient magnetic fields in accordance with one of the substeps (1) and (2) and the substeps (3) and (4).

12. An MR imaging apparatus comprising means to generate a static magnetic field, gradient magnetic fields and a radio-frequency magnetic field; measurement means to detect nuclear magnetic resonance signals from an object to-be-examined; and means to reconstruct an image by estimating unknown measurement data in such a way that, in estimating the image from measured data of a measured part of a measurement space and phase information of the image obtained beforehand, the measured data is first subjected to one-dimensional Fourier transformation in a readout direction and thereafter subjected to a reconstructing process in only a phase encode direction.

13. An MR imaging apparatus comprising means for generating a static magnetic field, means for generating gradient magnetic fields, means for generating a radio-frequency magnetic field, means for measuring NMR signals from an object to-be-examined on an arbitrary partial region which is so determined that, in the partial region of a measurement region required for obtaining both a real part and an imaginary part of a reconstructed image at a desired resolution, the partial region itself and a region obtained by moving the partial region in point symmetry with respect to an origin of a measurement space include the whole measurement region when combined, means for reconstructing the image by combining the measured signals and phase information on the reconstructed image, means for executing Fourier transformation of the measured signals, means for correcting the Fourier transformed signals with the phase information on an image space, and means to execute inverse Fourier transformation of the corrected signals so as to obtain estimated values of unmeasured signals for use in reconstructing an image.

14. An MR imaging apparatus comprising means for generating a static magnetic field, means for generating gradient magnetic fields, means for generating a radio-frequency magnetic field, means for measuring some of all echo signals which need to be measured for imparting a desired resolution to an image reconstructed by a Fourier transformation method, the radio-frequency magnetic field means applying the radio-frequency magnetic field to an object to-be-examined so as to cause nuclear magnetic resonance, the gradient magnetic field means applying a phase encoding gradient magnetic field to the object to-be-examined and thereafter applying a gradient magnetic field having a gradient in a read-out direction so as to enable measurement of the echo signal by the measuring means, means for reconstructing an image utilizing the measured signals, and means for extracting an image of a bloodstream part of the object to-be-examined from the reconstructed image, wherein all the echo signals and a total amount of application which is an amount of application of gradient magnetic fields necessary for measuring all the echo signals are obtained by at least one of the following four operations (1)-(4);

(1) the gradient magnetic field means applying the gradient magnetic field having the gradient in the readout direction, less than a half of the total amount of application, and subsequently applying a gradient magnetic field having a gradient in the read-out direction and being opposite to the former gradient magnetic field, simultaneously with the measurement of the echo signal by the measuring means;

(2) the gradient magnetic field means applying the gradient magnetic field having the gradient in the read-out direction and a gradient magnetic field having a gradient in the read-out direction and being opposite in polarity to the former gradient magnetic field, at least once, so that a summation of amounts of application of both the gradient magnetic fields may be less than a half of the total amount of application, and thereafter applying a gradient magnetic field in the read-out direction, simultaneously with the measurement of the echo signal by the measuring means;

(3) the gradient magnetic field means applying the gradient magnetic field having the gradient in the read-out direction, less than a half of the total amount of application, the radio-frequency magnetic field means subsequently applying a magnetization inverting radio-frequency magnetic field, and the gradient magnetic field means subsequently applying a gradient magnetic field having a gradient in the read-out direction and being opposite in polarity to the gradient magnetic field applied first, simultaneously with the measurement of the echo signal by the measuring means; and (4) the radio-frequency magnetic field means applying a magnetization inverting radio-frequency magnetic field, the gradient magnetic field means applying the gradient magnetic field having the gradient in the read-out direction and the gradient magnetic field having a gradient in the read-out direction and being opposite in polarity to the former gradient magnetic field, at least once before and after the radio-frequency magnetic field means applies the magnetization inverting radio-frequency magnetic field so that a difference between a summation of amounts of application before the radio-frequency magnetic field and a summation of amounts of application after the radio-frequency magnetic field are less than a half of the total amount of application, and the gradient magnetic field means thereafter applying a gradient magnetic field having a gradient in the read-out direction, simultaneously with the measurement of the echo signal by the measuring means.

* * * * *